United States Patent [19]
Melton et al.

[11] Patent Number: 5,774,330
[45] Date of Patent: Jun. 30, 1998

[54] APPARATUS FOR SUPPORTING OPERATIONAL COMPONENTS OF A PERSONAL COMPUTER

[75] Inventors: Jimmy A. Melton, San Jose; Wayman Lee, Santa Clara, both of Calif.; Wayne H. Miller, West Linn, Oreg.

[73] Assignee: Apple Computer, Inc., Cupertino, Calif.

[21] Appl. No.: 431,418

[22] Filed: May 1, 1995

[51] Int. Cl.⁶ ................................................. H05K 5/00
[52] U.S. Cl. .......................... 361/683; 361/740; 361/759; 312/223.2
[58] Field of Search .................................... 361/683–686, 361/740, 759, 801; 312/223.2

[56] References Cited

U.S. PATENT DOCUMENTS 5,136,465  8/1992  Benck et al. ......................... 361/683 X
5,317,483  5/1994  Swindler ................................ 361/801
5,460,441  10/1995  Hastings et al. ................. 312/223.2 X

*Primary Examiner*—Michael W. Phillips
*Assistant Examiner*—Jayprakash N. Gandhi
*Attorney, Agent, or Firm*—Burns, Doane, Swecker & Mathis, L.L.P.

[57] ABSTRACT

A personal computer includes a chassis in which expansion cards and a processor card can be mounted in an upright parallel manner. An end of each expansion card is received in a vertical slot carried by a speaker component of the computer. A baffle member is swingably mounted on the chassis for rotation about a horizontal axis between open and closed positions. In the open position of the baffle member, the expansion cards can be inserted or removed. In the closed position of the baffle member, ribs thereof engage and stabilize upper edges of the cards. Hard and floppy drives are insertable into respective bays disposed within the chassis in a rear-to-front direction (in contrast to a front-to-rear direction), so that EMI shields located in front of those bays do not have to be removed to permit insertion or removal of the disc drives.

7 Claims, 6 Drawing Sheets

APPARATUS FOR SUPPORTING OPERATIONAL COMPONENTS OF A PERSONAL COMPUTER

BACKGROUND OF THE INVENTION

The invention relates to personal computers and, in particular, to the mounting of various operational components within a chassis of a personal computer.

A personal computer typically comprises a metallic chassis which houses, and provides EMI shielding for, operational components of a computer, such as a motherboard, optional expansion cards, power supply, disc drive, electric cables, plug-in connectors, cooling fan, etc. An outer housing can also be provided which encloses the chassis.

The expansion cards, which can be added by the user to provide additional functions, are mounted in vertical, parallel relationship within the chassis. It has been known that a cover, which overlies the chassis to provide EMI shielding therefore, may include guide ribs for engaging and stabilizing the upper edges of the expansion cards. That is practicable, however, if the cover is installable and removable in a vertical direction, rather than in a horizontal direction.

Accordingly, it would be desirable to enable expansion cards to be properly supported regardless of the manner in which the cover is installed and removed.

Furthermore, the chassis includes bays for receiving hard and floppy disc drives. Those drives are installed into the bays in a front-to-rear direction and then the bays are overlaid by an EMI shielding plate. This requires that during the assembly of the computer, the drives must be installed prior to the front EMI shield. Furthermore, in order to remove one or more of the drives, e.g., to reconfigure the computer, it is necessary to remove the shields. Those restrictions serve to limit the possible assembly procedures and make the disassembly procedure more difficult.

It would be desirable to simplify the disassembly procedure and provide more freedom or versatility in choosing an assembly procedure.

SUMMARY OF THE INVENTION

One aspect of the present invention relates to a personal computer comprising a chassis in which are mounted a power supply and a motherboard. The chassis forms a space for receiving expansion cards. A plurality of slots are disposed in the chassis and arranged to face the space for receiving ends of respective expansion cards. A baffle member is mounted to the chassis for movement between an open position spaced horizontally from the space and a closed position overlying the space for stabilizing expansion cards by engaging upper portions thereof.

The slots can be formed in a removable element, such as a speaker bracket.

The baffle member is preferably mounted to the chassis for swinging movement about a horizontal axis of rotation.

The baffle member preferably includes a rib extending transversely relative to expansion cards, the rib engaging upper portions of the expansion cards when the baffle member is in its closed position.

The computer may also include a processor card mounted on the motherboard. The rib on the baffle member includes a downwardly open slot which receives the upper edge of the processor card when the baffle member is in its closed position.

Another aspect of the invention relates to a personal computer which comprises a chassis having a floor, and upright front and side walls, and a removable top cover. A power supply is mounted in the chassis, and at least one bay is disposed adjacent the front wall for receiving a disk drive. A rear end of the bay is exposed when the cover is removed, to enable the disk drive to be installed therein. The bay includes a guide for receiving the disk drive in a rear-to-front direction.

Alternatively, or in addition, there can be a removable rear panel which exposes the rear end of the bay to permit rear-to-front installation of the drive.

Preferably, the guide includes a track which includes a snap-in connector for locking the disk drive in place upon being slid into the bay along the track in the rear-to-front direction.

Preferably, the computer further includes an EMI shield plate mounted in front of the bay. The disk drive is insertable and removable relative to the bay in the rear-to-front direction while the EMI shield is in a mounted state.

BRIEF DESCRIPTION OF THE DRAWINGS

The objects and advantages of the invention will become apparent from the following detailed description of preferred embodiments thereof in connection with the accompanying drawings in which like numerals designate like elements and in which.

DETAILED DESCRIPTION OF THE PREFERRED EMBODIMENTS OF THE INVENTION

Figure 1:
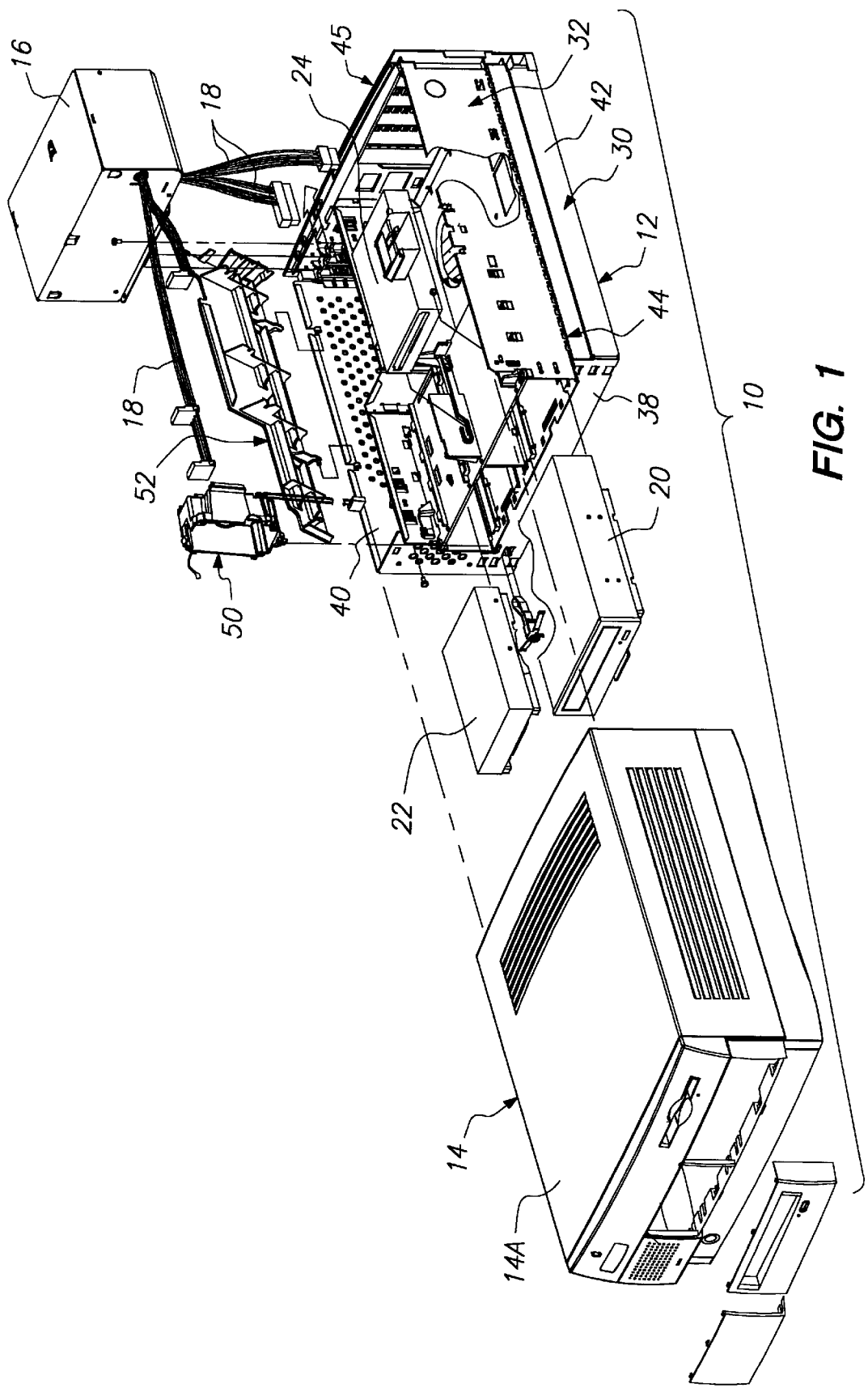
FIG. 1 is an exploded front top perspective view of a personal computer according to the present invention.
Figure 4:
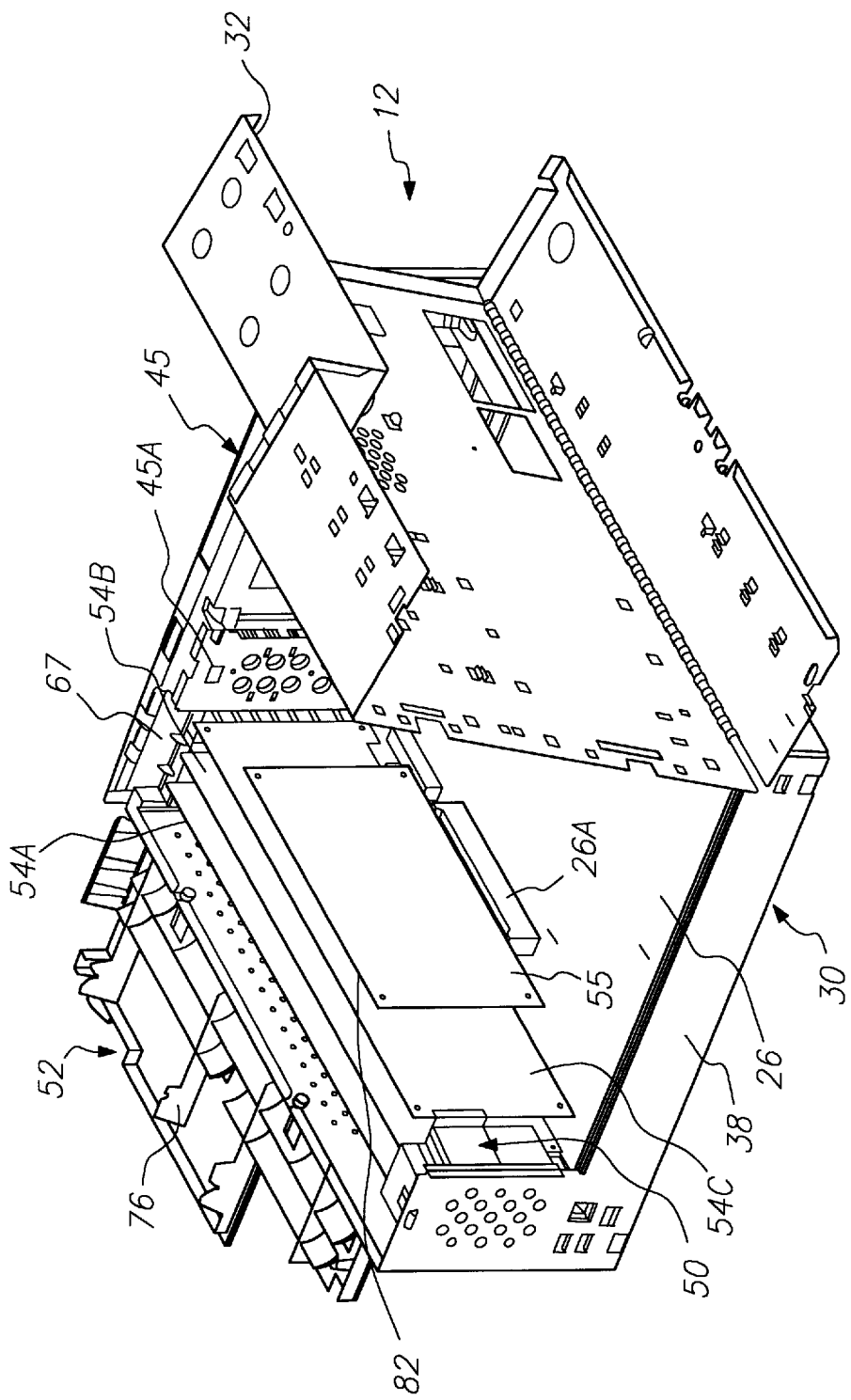
FIG. 4 is a front top perspective view of the chassis, with a subchassis thereof swung to an open position, and with a baffle member swung to an open position for exposing expansion cards situated within the chassis.
Figure 5:
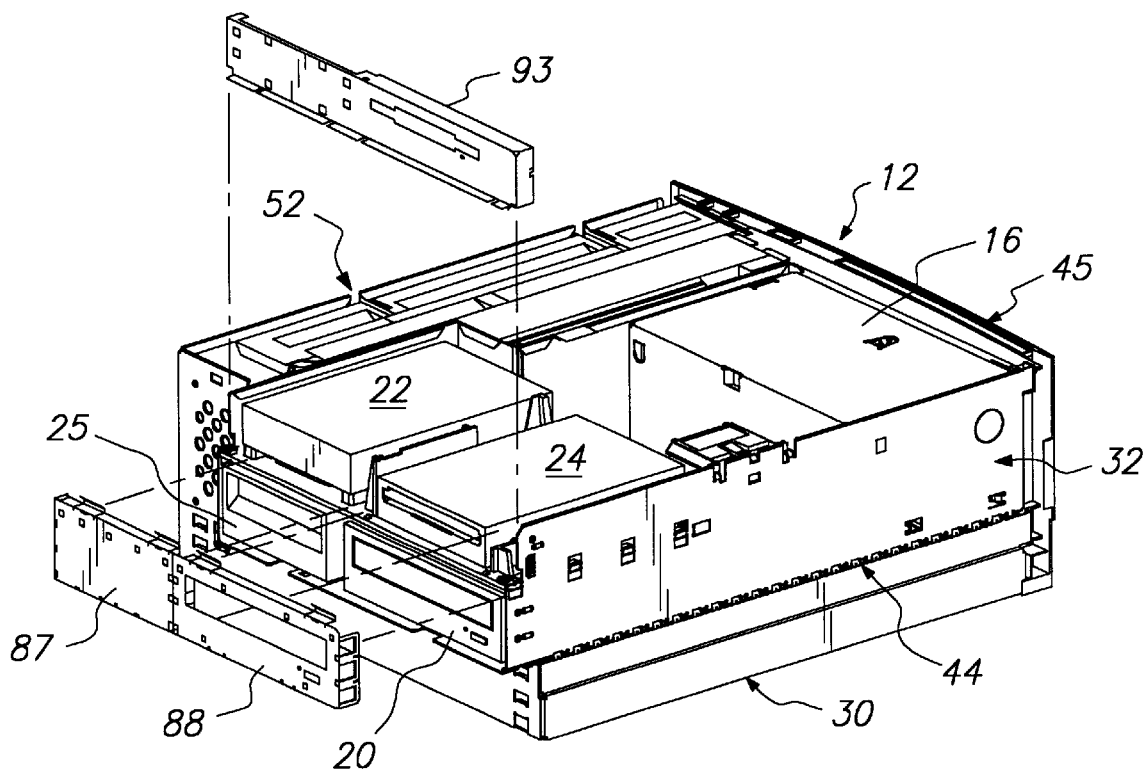
FIG. 5 is an exploded front top perspective view of the chassis with front EMI shield plates in the process of being installed.

Depicted in FIG. 1 is a personal computer 10 comprised of a metal chassis 12 (e.g., steel), an outer housing 14 (e.g., formed of plastic), and electric operational components including a power supply 16 having electric cables 18, a CD ROM 20, a hard drive 22, and a floppy drive 24. Shown in FIG. 5 is another hard drive 25. The cables 18 are to be connected to a motherboard, which is shown in FIG. 4. The housing 14 includes a top cover 14A which overlies the chassis and includes a metal plate (not shown) on its underside which provides EMI shielding.

Figure 2:
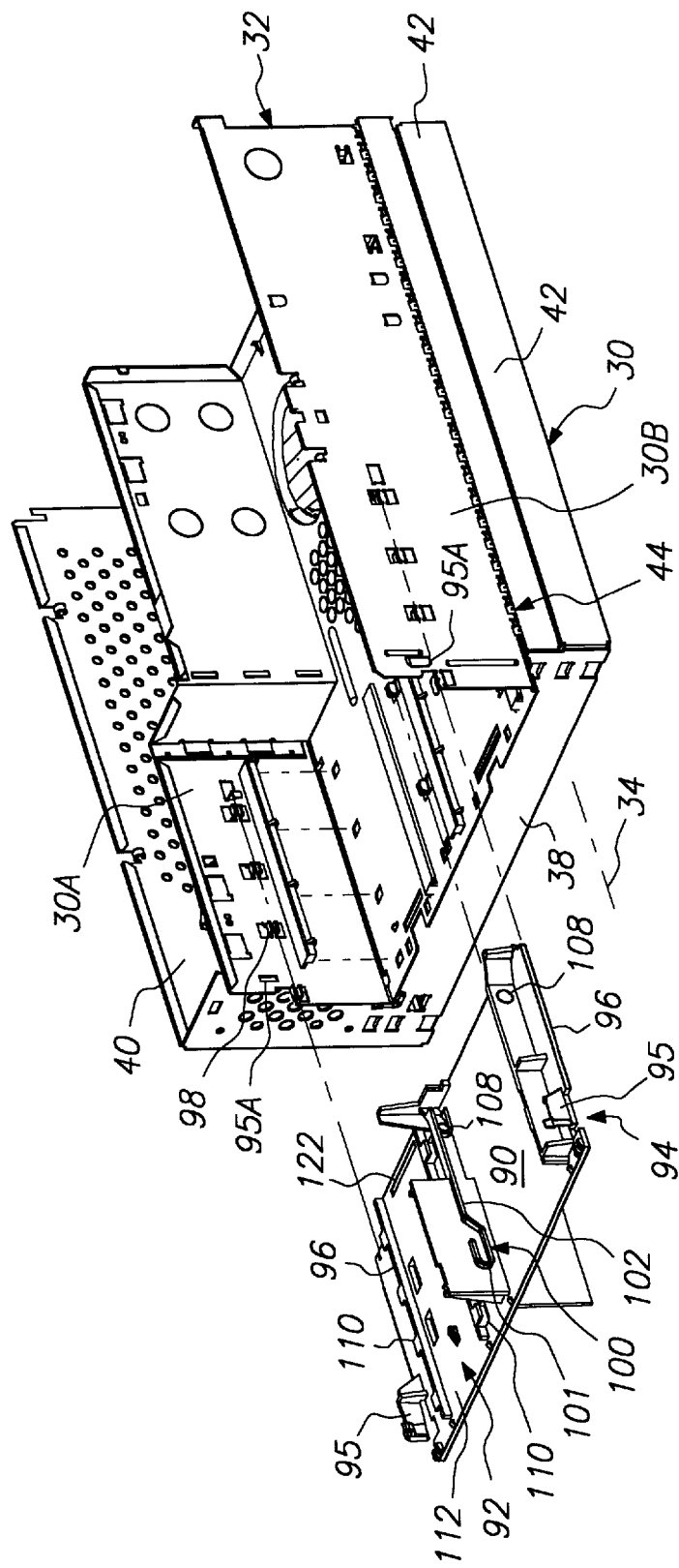
FIG. 2 is an exploded front top perspective view of a chassis portion of the computer and an insert which forms bays for receiving disk drives.

The chassis 12 comprises a main or outer section 30, and a second section or subchassis 32 hingedly connected to the main section 30 about a horizontal axis of rotation 34 (see FIG. 2). The subchassis 32 carries bays for mounting the hard and floppy disc drives 22, 24, 25, and the CD ROM 20. Also, the power supply 16 having an integral cooling fan is mounted to the subchassis 32. The motherboard 26 is mounted within a space formed by the main chassis section 30.

The main chassis section 30 includes a bottom wall (not shown), a front wall 38 projecting upwardly from the bottom wall, and two side walls 40, 42 also projecting upwardly from the bottom wall. One of the side walls 42 is shorter than the other side wall 40, and is hinged to the subchassis 32 by a hinge structure 44. A rear panel 45 carrying EMI shielding is attached to the rear of the main chassis section 30. Attention is directed to commonly owned U.S. application Ser. Nos. 08/431,421, 08/431,417 and U.S. Pat. No. 5,561, 893 for a description of various aspects of the chassis. The disclosures of those documents are incorporated herein by reference.

Also mounted to the chassis are a bracket 50 for a speaker, and a swingable baffle or guide 52 for supporting the upper edges of expansion cards 54A–C and the upper edge of a processor card 55 disposed in the chassis (see FIG. 4). The cards 54A–C and 55 are mounted in connectors 26A disposed on the motherboard. The expansion cards 54A–C can be added by the user to provide additional functions. The processor card 55 is factory or user installed and is mounted on the motherboard. All cards 54A–C and 55 are disposed in a portion of the main chassis section situated next to the subchassis 32.

Figure 7:
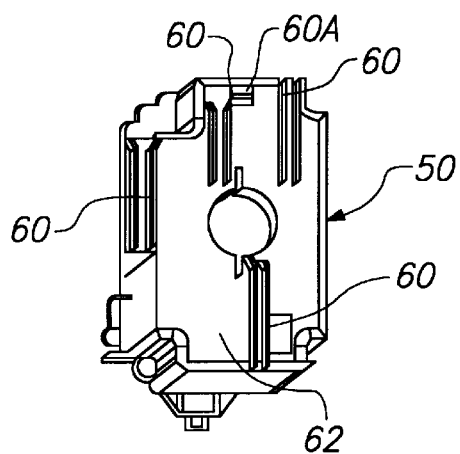
FIG. 7 is a rear bottom perspective view of a speaker according to the present invention.
Figure 8:
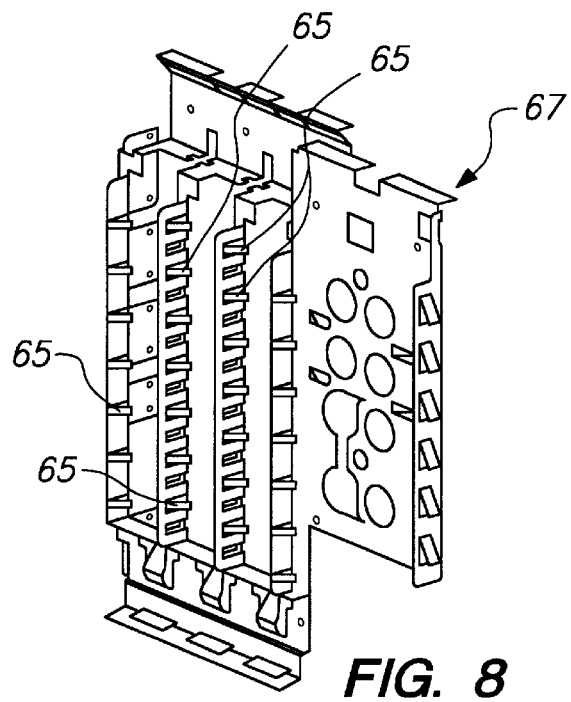
FIG. 8 is a top front perspective view of an EMI shield attached to a rear panel of the computer.

Front vertical ends of the expansion cards 54A–C are mounted in vertical slots 60 formed in a rear face 62 of the speaker bracket 50 (see FIG. 7). Rear vertical ends of the expansion cards 54A–C are in engagement with vertically spaced spring fingers 65 of a metallic EMI shield 67 plate carried by the rear panel 45 (see FIG. 8), in order to provide EMI shielding, as is conventional.

Figure 3:
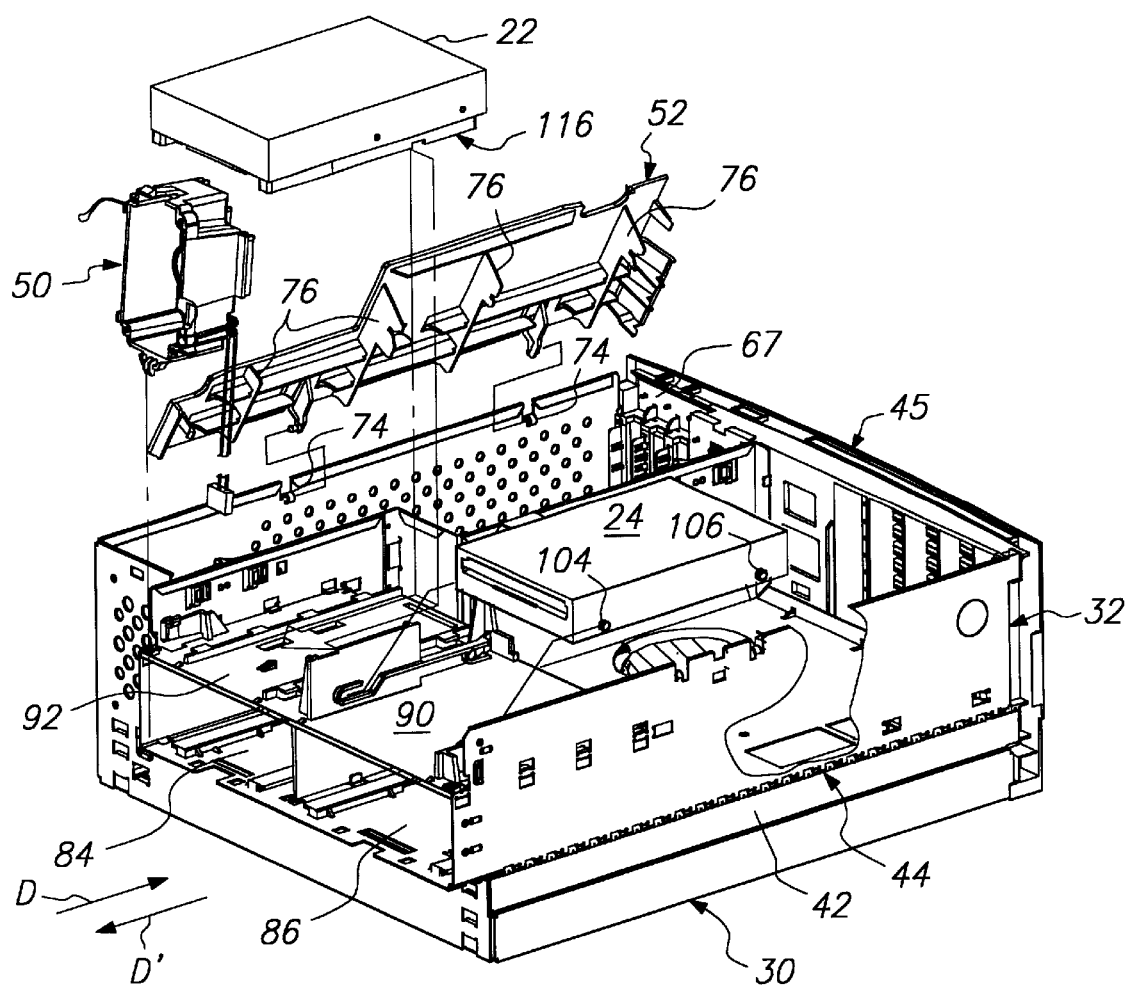
FIG. 3 is an exploded front top perspective view of the chassis.
Figure 6:
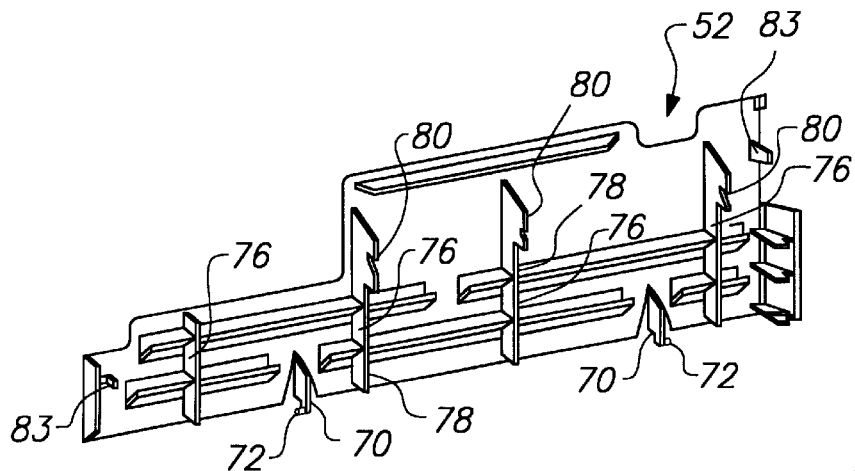
FIG. 6 is a bottom perspective view of the baffle member according to the present invention.

The swingable baffle 52, which is preferably molded in one piece from a plastic material, includes a pair of mounting legs 70 having cylindrical bosses 72 (see FIG. 6). The bosses 72 are configured to snap into eyelets 74 formed by bent cut-out portions of the upper edge of the side wall 40 of the main chassis section 30 (see FIG. 3). Once installed, the bosses 72 define an axis of rotation for the swingable baffle 52. The baffle 52 includes a plurality of ribs 76 which extend transversely relative to the axis of rotation defined by the bosses 72. Those ribs 76 include edges 78 arranged to bear downwardly against the upper edges 79 of the expansion cards 54A–C when the baffle 52 has been swung to an inward or closed position overlying the cards, as shown in FIG. 5. Thus, upper edges of those cards 54A–C are held frictionally against transverse movement.

Some of the ribs 76 include slots 80 aligned in a direction extending parallel to the axis of rotation for receiving the upper edge 82 of the processor card 55. Thus, the upper edge of the processor card 55 is positively held against transverse movement.

In order to remove, add, or exchange expansion cards, the baffle 52 is swung to an outward or open position (FIG. 4), thereby enabling expansion cards to be removed or installed in a vertical direction.

The baffle 52 includes two snap fingers 83 that snap into holes 45A and 60A formed in the rear panel 45 and speaker bracket 60, respectively (see FIGS. 4 and 7), to yieldably hold the baffle in its closed position. The baffle 52 functions to stabilize the upper edges of the expansion cards 54A–C and processor card 55 independently of the cover 14A. Hence, the cover (i.e., the housing 14) can be designed for insertion/removal in any direction, i.e. vertically or horizontally, rather than being restricted to vertical insertion/removal.

Turning now to the mounting of the drives, the hard drive 25 and the CD ROM 20 are mounted in respective bays 84, 86 formed in the subchassis 32. Insertion and removal of those drives 25, 20 are performed in a front-to-rear horizontal direction D. Thereafter, EMI shield plates 87, 88 are installed in front of the drives 25, 20 (see FIG. 5).

As regards the other drives 22, 24, the floppy drive 24 is mounted in a bay 90, and the hard drive 22 is mounted in a bay 92. An EMI shield 93 is installed in the front of those bays (see FIG. 5). The bays 90, 92 are formed by an insert 94 (see FIG. 2) which is insertable into the subchassis 32 and locked therein by spring fingers 95 which snap into holes 95A formed in the subchassis 32. Edges 96 of the insert 94 are slidable into slots formed by bent-in portions 98 of the side walls 30A, 30B of the subchassis 32. The bay 90 includes opposing guide tracks 100 (only one track depicted) formed by a rib 102. Each track 100 is open at its rear end and closed at 101 at its front end. The floppy drive 24 includes pairs of front and rear bosses 104, 106 which can be slid into the tracks 102 (see FIG. 3). Rear portions of the tracks 100 can be elastically spread apart as the bosses pass therethrough in a rear-to-front direction D'. Then, when recesses 108 of the elastic rear portions of the tracks become aligned with the rear bosses 104, 106 those rear portions snap back toward one another to capture the rear bosses 104 in the recesses 108 and thereby lock the floppy drive 24 in place.

Figure 9:
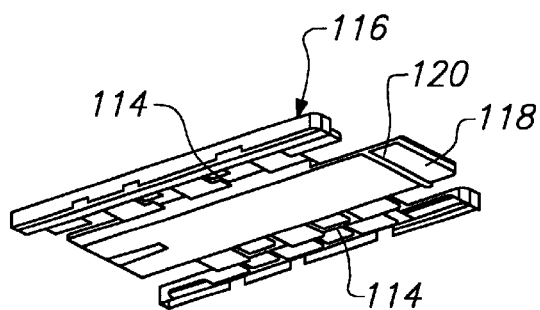
FIG. 9 is a bottom perspective view of a carrier mounted to the bottom of a hard drive according to the present invention.

The other bay 92 includes two sets of tabs 110 spaced above a floor 112 of the insert for receiving cooperating tabs 114 formed on a carrier 116 attached to the bottom of the hard drive 22 (see FIG. 9). The carrier 116 also includes an elastically flexible tongue 118 having a downwardly extending projection 120 which is insertable into a slot 122 formed in the floor 112 of the insert 94 after the tabs 114 have been slid in a rear-to-front direction along guide tracks formed between the tabs 110 and floor 112 of the insert. The slot 122 is formed at the rear of the bay 92, so that the hard drive 22 must be inserted in a rear-to-front direction D' in order for the tongue to become locked in place.

It should be appreciated that the prior art required the drives to be inserted from the front, i.e., in the front-to-rear direction D. That meant (i) that the drives 22, 24 had to be installed prior to the front EMI shield plate 93 (sse FIG. 5), and (ii) that the shield plate 93 had to be removed in order to replace the drives 22, 24 for reconfiguring the computer. By arranging the drives 22, 24 to be installed from the rear, the drives 22, 24 can be installed either before or after the EMI shield 93, as desired, thereby providing greater flexibility in the assembly process. Furthermore, if it becomes necessary to remove, add, or replace one of the drives 22, 24 prior to shipping an assembled conveyor, that can be done without having to remove the shield 93.

The drives 20, 22 would normally be installed by removing the cover 14A and inserting the drives downwardly through the top of the subchassis before being moved in the rear-to-front direction D'. However, if the power supply 16 has not been installed, it may be desirable to instead remove the rear panel 45 in order to install the drives 22, 24.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A personal computer comprising a chassis including upright outer side walls; a power supply; a motherboard mounted in said chassis; said chassis forming a space for receiving expansion cards; a plurality of vertical slots disposed in said chassis and facing said space for receiving ends of respective expansion cards; and a baffle member mounted to said chassis for movement between an open position spaced horizontally from the space, and a closed position overlying said space for stabilizing expansion cards by engaging upper portions thereof, said baffle member being swingably mounted to an upper edge of one of said outer side walls for swinging movement about a horizontal axis oriented parallel to said upper edge.

2. The personal computer according to claim 1, wherein said baffle member includes a rib arranged to extend transversely relative to expansion cards and engage upper portions thereof when said baffle member is in said closed position.

3. The personal computer according to claim 2, wherein said rib includes a downwardly open slot for receiving an upper edge of a processor card in said space when said baffle member is in said closed position.

4. The personal computer according to claim 1, wherein said baffle member includes a pair of legs each having a cylindrical boss formed thereon, said bosses mounted by a snap-fit in respective sockets formed in said upper edge and defining said axis of rotation.

5. The personal computer according to claim 1 further including an element removably mounted in said chassis and forming said slots.

6. The personal computer according to claim 5, wherein said removable element is a speaker bracket.

7. The personal computer according to claim 1, wherein said slots are open horizontally in directions parallel to said upper edge.

* * * * *